(12) United States Patent
Tomioka et al.

(10) Patent No.: US 7,142,425 B2
(45) Date of Patent: Nov. 28, 2006

(54) LIQUID COOLING SYSTEM INCLUDING A LIQUID ABSORPTION AND A LEAK DETECTION DEVICE

(75) Inventors: Kentaro Tomioka, Sayama (JP); Katsumi Hisano, Kashiwa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 202 days.

(21) Appl. No.: 10/647,332

(22) Filed: Aug. 26, 2003

(65) Prior Publication Data

US 2004/0188069 A1 Sep. 30, 2004

(30) Foreign Application Priority Data

Aug. 26, 2002 (JP) .............................. 2002-245372

(51) Int. Cl.
*H05K 7/20* (2006.01)
*G08B 21/00* (2006.01)
*G01M 3/04* (2006.01)
*G01M 3/08* (2006.01)
*H01B 9/06* (2006.01)
*F28F 7/00* (2006.01)
*H01L 23/34* (2006.01)

(52) U.S. Cl. .......................... 361/699; 340/605; 73/40; 73/46; 174/15.1; 165/80.4; 257/714

(58) Field of Classification Search ........ 361/687–723; 165/80.4; 174/15.1; 285/148.16, 148.15, 285/242, 254, 331, 403, 374; 340/605; 73/46, 49.8

See application file for complete search history.

(56) References Cited

U.S. PATENT DOCUMENTS

| | | | | |
|---|---|---|---|---|
| 2,477,533 A | * | 7/1949 | Whiting | 277/625 |
| 4,990,541 A | * | 2/1991 | Nielsen et al. | 521/70 |
| 5,323,847 A | * | 6/1994 | Koizumi et al. | 165/104.33 |
| 5,383,340 A | * | 1/1995 | Larson et al. | 62/259.2 |
| 6,199,915 B1 | * | 3/2001 | Becker | 285/239 |
| 6,510,052 B1 | * | 1/2003 | Ishikawa et al. | 361/687 |
| 6,519,148 B1 | * | 2/2003 | Nakagawa et al. | 361/687 |
| 6,556,439 B1 | * | 4/2003 | Shibasaki | 361/687 |
| 6,611,425 B1 | * | 8/2003 | Ohashi et al. | 361/687 |
| 6,776,421 B1 | * | 8/2004 | Florence et al. | 277/602 |
| 2002/0039279 A1 | * | 4/2002 | Ishikawa et al. | 361/687 |

(Continued)

FOREIGN PATENT DOCUMENTS

JP 58-106852 6/1983

(Continued)

OTHER PUBLICATIONS

Notification of Reasons for Rejection mailed by the Japanese Patent Office on Oct. 12, 2004, for Japenese Patent Application No. 2002-245372, and English-language translation of Notification.

*Primary Examiner*—Lisa Lea-Edmonds
*Assistant Examiner*—Zachary Pape
(74) *Attorney, Agent, or Firm*—Finnegan, Henderson, Farabow, Garrett & Dunner, L.L.P.

(57) ABSTRACT

Disclosed herein is an electronic apparatus that comprises a housing, and a circulating path. A heat-generating component is contained in the housing. Liquid coolant for cooling the heat-generating component flows through the circulating path. The circulating path has a first connecting end and a second connecting end connected to the first connecting end. The junction between the first connecting end and the second connecting end is covered with a coolant-absorbent member. The electronic apparatus further includes a leak detection system to alert the user of a fluid leak within the apparatus and a liquid absorption means to absorb any leaking fluid.

14 Claims, 7 Drawing Sheets

U.S. PATENT DOCUMENTS

| | | | |
|---|---|---|---|
| 2003/0151892 A1* | 8/2003 | Kondo et al. | 361/687 |
| 2004/0105234 A1* | 6/2004 | Messina et al. | 361/699 |
| 2005/0243510 A1* | 11/2005 | Tomioka et al. | 361/687 |

FOREIGN PATENT DOCUMENTS

| | | |
|---|---|---|
| JP | 4-258591 | 9/1992 |
| JP | 7-35453 | 2/1995 |
| JP | 7-142886 | 6/1995 |
| JP | 2002-232176 | 8/2002 |
| JP | 2003-124672 | 4/2003 |

* cited by examiner

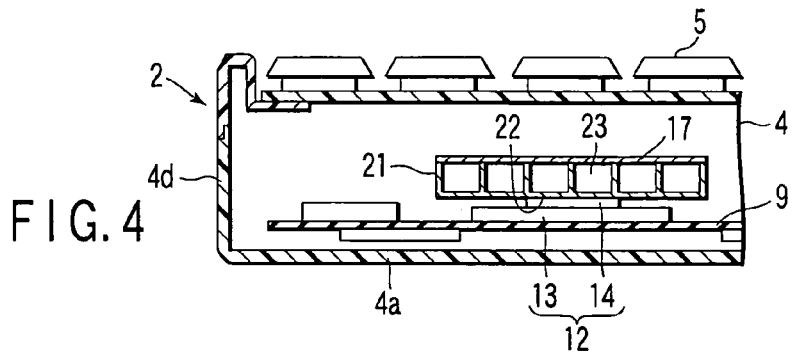
FIG. 4
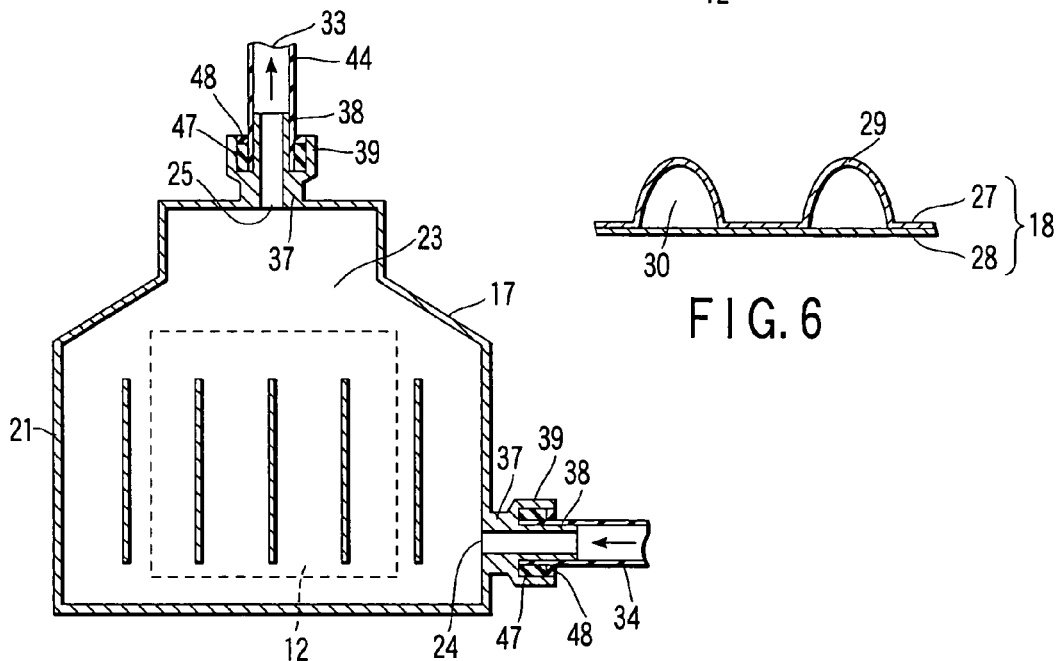
FIG. 5
FIG. 6
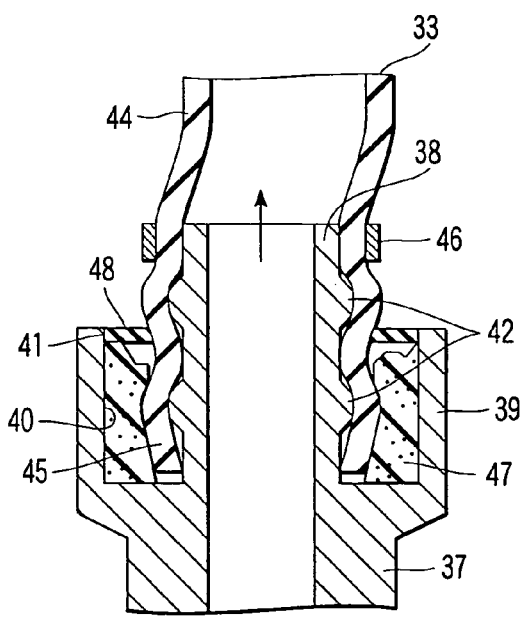
FIG. 7

LIQUID COOLING SYSTEM INCLUDING A LIQUID ABSORPTION AND A LEAK DETECTION DEVICE

CROSS-REFERENCE TO RELATED APPLICATIONS

This application is based upon and claims the benefit of priority from the prior Japanese Patent Application No. 2002-245372, filed Aug. 26, 2002, the entire contents of which are incorporated herein by reference.

BACKGROUND OF THE INVENTION

1. Field of the Invention

The present invention relates to an electronic apparatus in which a liquid coolant is used to cool a heat-generating component such as a CPU (Central Processing Unit). More particularly, the invention relates to a structure that prevents the liquid coolant from leaking from the circulating path.

2. Description of the Related Art

A CPU is incorporated in, for example, notebook-type portable computers. The heat that the CPU generates while operating increases as its data-processing speed rises and it performs more and more functions. The higher the temperature of the CPU, the less efficiently it operates. To cool the CPU, so-called "cooling system of liquid cooling type" have been developed in recent years. The cooling system uses a liquid coolant that has a far higher specific heat than air.

Jpn. Pat. Appln. KOKAI Publication No. 7-142886 discloses a cooling system of liquid cooling type, configured for use in portable computers that comprises a main unit and a display unit. The cooling system comprises a heat-receiving header, hear-radiating header, and a tube for circulating the coolant. The heat-receiving header is provided in the main unit and thermally connected to the CPU incorporated in the main unit. The heat-radiating header is provided in the display unit and located at the back of the display panel incorporated in the display unit. The tube extends from the main unit to the display unit. It connects the heat-receiving header and the heat-radiating header.

In this cooling system, the coolant is heated in the heat-receiving header as it receives the heat generated by the CPU. The coolant thus heated is transferred via the tube into the heat-radiating header. The heat-radiating header radiates the heat generated by the CPU, as the coolant flows through it. The coolant is cooled as the heat-radiating header performs heat exchange. The coolant thus cooled is transferred via the tube, back into the heat-receiving header through the tube. Back in the heat-receiving header, the coolant receives the heat from the CPU again. As the coolant is circulated, the heat is transmitted from the CPU to the heat-radiating header with high efficiency and the heat-radiating head radiates the heat. This enhances the efficiency of cooling the CPU.

In the cooling system of liquid cooling type, the coolant is circulated between the heat-receiving header and the heat-radiating header through the tube. The coolant may leak from the circulation path. The leaking may occur at, for example, the junction between the heat-receiving header and the tube. In the conventional cooling systems of this type, tube couplings are arranged at the coolant inlet port and the coolant outlet port. The tube has its one open end pushed into a tube coupling and is thereby connected to the heat-receiving header. To render the connection more firm and reliable, the junction between the tube and the tube coupling is tightened with a band. The band prevents the tube from being disconnected from the tube coupling.

The cooling system of liquid cooling type can maintain its efficiency of cooling the CPU as long as the coolant is smoothly circulated, even if the coolant leaks a little or contains bubbles.

If the coolant keeps on leaking from the circulation path, however, it will contact the CPU and the other electronic parts provided in the main unit. If the coolant contains antifreeze, it is electrically conductive. Particularly in this case, the coolant may damage the CPU and the other electronic parts, disabling the portable computer in some cases. Should the leaking coolant flow outside the main unit, it would spill over the desk or make cloths dirty, impairing the use environment of the computer.

The junction between the tube and the heat-receiving header may loosen as the tube deforms, assuming the same shape as the tube coupling. It is then no longer possible to prevent the coolant from leaking at the junction. In this case, the coolant may flow in the main unit.

A coupling structure that prevents liquid from the junction between two tubes is disclosed in, for example, Jpn. Pat. Appln. KOKAI Publication No. 4-258591. The coupling structure comprises a packing and a fixture member, both shaped like a hollow cylinder and made of rubber material that contains super absorbent polymer. The packing is mounted on one end of the tube, and the fixture member is mounted on an end of the other tube. The packing and the fixture member bite each other, sealing the abutting ends of the tubes in watertight fashion.

The coupling structure, however, needs a special stopper for fastening the packing and the fixture member to the two tubes, respectively. Without the stopper, the fixture member may be displaced with respect to the packing when it is fitted into the packing. Further, both the packing and the fixture member need to have a plurality of projections so that they may bite each other.

Consequently, the packing and the fixture member are complex in shape. This raises their manufacturing cost. It should be noted that the coupling structure is one designed to couple pressure tubes for use in multi-story, apartment houses. They differ, in technical field, from those for used in apparatuses, such as portable computers, which incorporate electronic parts. Besides, Jpn. Pat. Appln. KOKAI Publication No. 4-258591 neither teaches nor suggests that the coupling structure may be used in cooling systems for use in electronic apparatuses.

BRIEF SUMMARY OF THE INVENTION

According to an embodiment of the present invention, there is provided an electronic apparatus comprises: a housing having a heat-generating component; a circulating path through which liquid coolant for cooling the heat-generating component flows, the circulating path having a first connecting end and a second connecting end connected to the first connecting end; and a coolant-absorbent member provided to a junction between the first connecting end and the second connecting end.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a cross-sectional view of the portable computer, illustrating the positional relation between a CPU and a heat-receiving portion;

FIG. 5 is a cross-sectional view of the heat-receiving portion provided in the first embodiment of the invention;

FIG. 6 is a cross-sectional view of a radiator provided in the first embodiment of the invention;

FIG. 7 is a cross-sectional view of the coupling structure that couples a tube coupling and a tube in the first embodiment of the invention;

DETAILED DESCRIPTION OF THE INVENTION

A first embodiment of the present invention will be described with reference to FIGS. 1 to 7.

Figure 1:
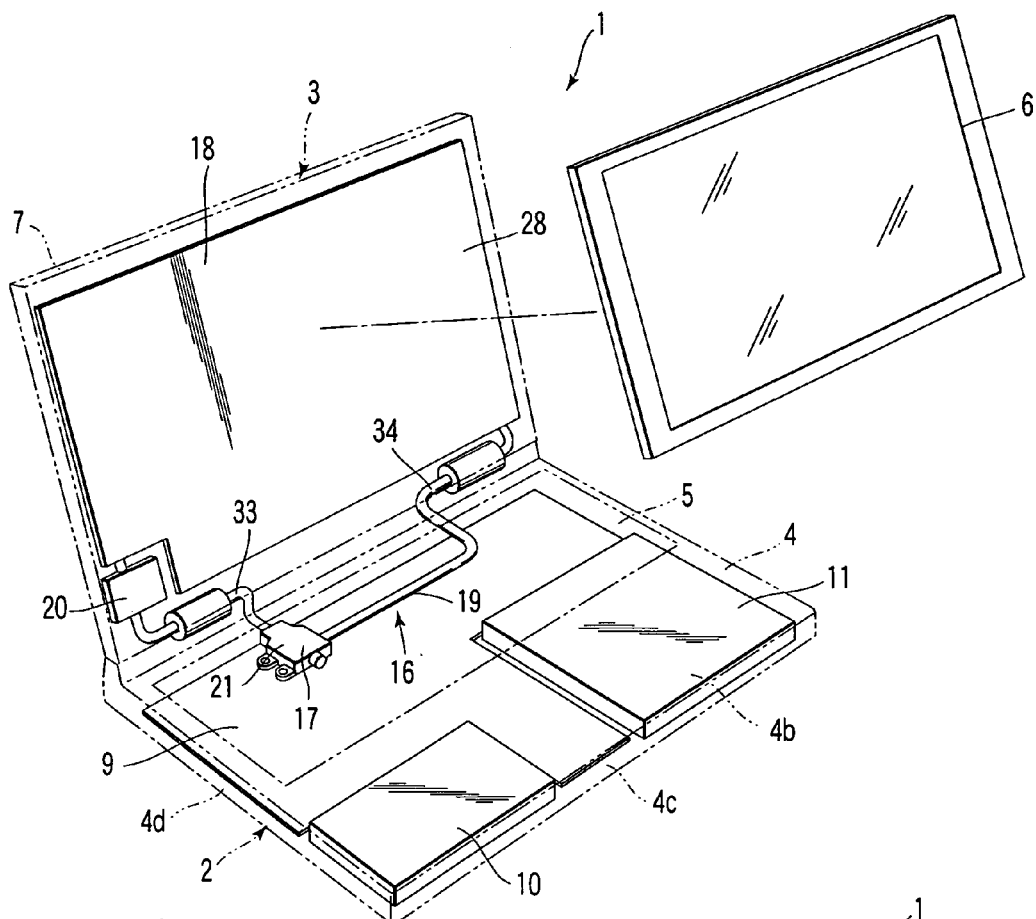
FIG. 1 is a perspective view of a portable computer according to a first embodiment of this invention, which incorporates a cooling unit of liquid cooling type.
Figure 2:
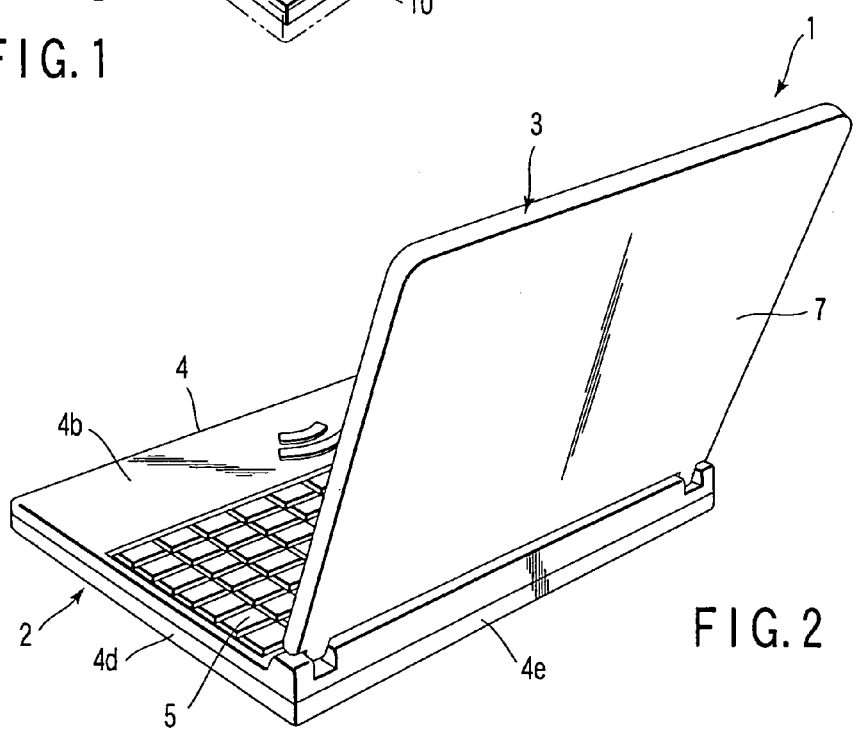
FIG. 2 is a perspective view of the portable computer with its display unit rotated to the opened position.
Figure 3:
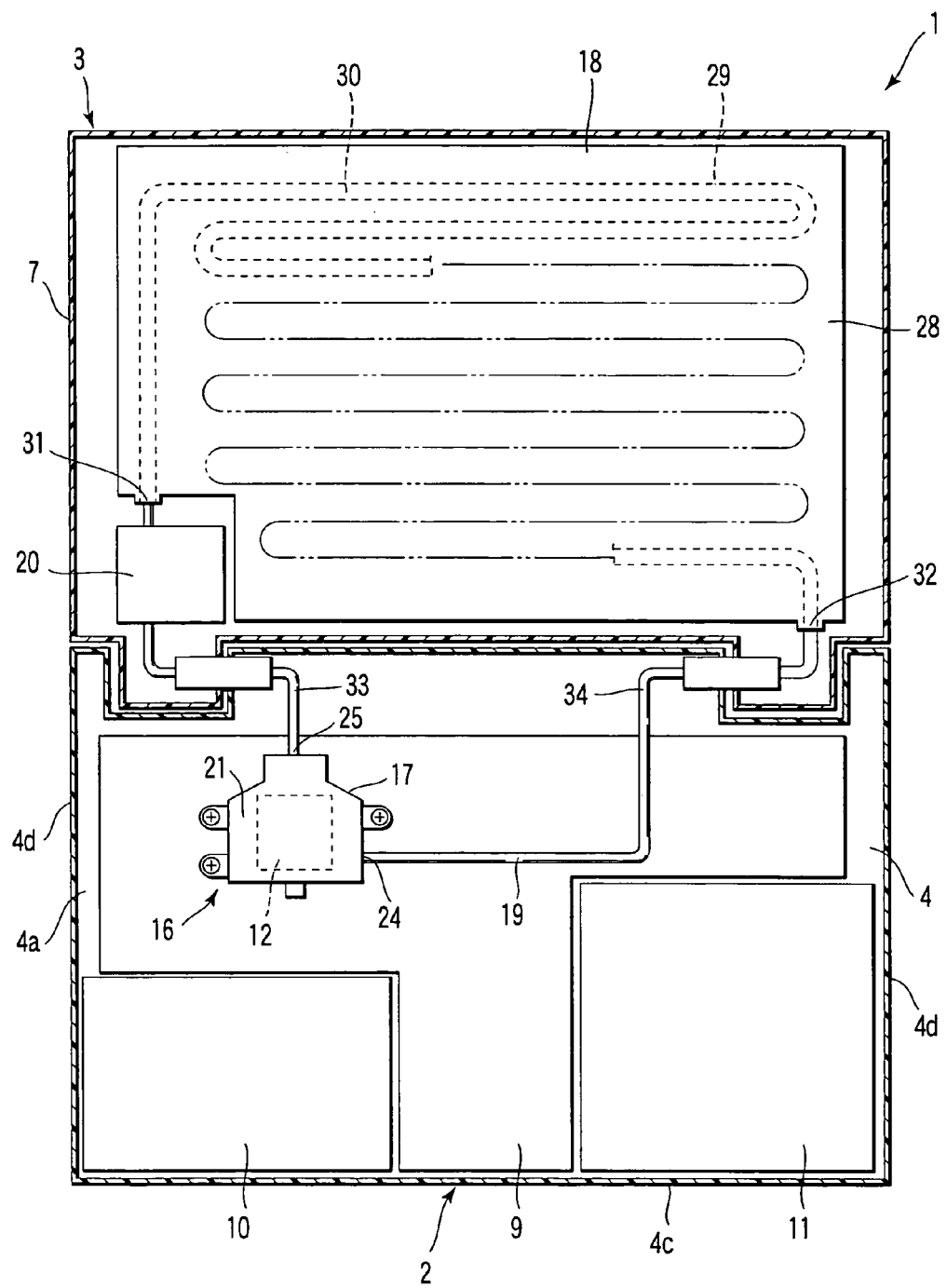
FIG. 3 is a cross-sectional view of the portable computer, which incorporates the cooling unit of liquid cooling type.

FIGS. 1 to 3 show a portable computer, or an electronic apparatus according to this invention. The portable computer 1 comprises a computer main unit 2 and a display unit 3. The computer main unit 2 has a housing 4 that is shaped like a flat box. The housing 4 comprises a bottom wall 4a, top wall 4b, front wall 4c, left and right sidewalls 4d, and back wall 4e. The top wall 4b supports a keyboard 5.

The display unit 3 comprises a liquid crystal display panel 6 and a display housing 7 containing the panel 6. The display housing 7 is hinged to the rear edge of the housing 4 by means of hinges (not shown). The display unit 3 can therefore rotate between a closed position and an opened position. At the closed position, the display unit 3 covers the keyboard 5 from above. At the opened position, the display unit 3 stands up, exposing the keyboard 5.

As FIGS. 1 and 3 show, the housing 4 contains a printed circuit board 9, a hard disk drive 10, and a CD-ROM drive 11. The printed circuit board 9, hard disk drive 10 and CD-ROM drive 11 are arranged on the bottom wall 4a of the housing 4.

As seen from FIG. 4, a CPU (Central Processing Unit) 12, or a heat-generating component, is mounted on the upper surface of the printed circuit board 9. The CPU 12 is a semiconductor package of BGA type, which has a base 13 and an IC chip 14 mounted on the center part of the base 13. The IC chip 14 generates much heat as it operates, processing data at high speed and performing many functions. The IC chip 14 needs to be cooled to keep stably operating.

The portable computer 1 further comprises a cooling unit 16 of liquid cooling type. The cooling unit 16 comprises a heat-receiving portion 17, a heat radiating portion, or radiator 18, a circulating path 19, and a pump 20.

As FIGS. 4 and 5 depict, the heat-receiving portion 17 has a housing 21 made of metal. The housing 21 is a flat box, which is secured to the upper surface of the printed circuit board 9. The housing 21 is somewhat larger than the CPU 12. The housing 21 has a flat lower surface, which functions as a heat-receiving surface 22. The heat-receiving surface 22 contacts a layer of heat-conductive grease (not shown) or a heat-conductive sheet (not shown), which in turn contacts the IC chip 14 of the CPU 12. Hence, the surface 22 is thermally connected to the IC chip 14.

The housing 21 has a coolant passage 23, coolant inlet port 24, and coolant outlet port 25. The coolant passage 23 is thermally connected to the heat-receiving surface 22. The ports 24 and 25 are located, respectively upstream and downstream of the coolant passage 23.

The radiator 18 is interposed between the liquid crystal display panel 6 and the back of the display housing 7. The radiator 18 is a rectangular plate that is as large as the liquid crystal display panel 6. As FIG. 6 shows, the radiator 18 comprises a first heat-radiating plate 27 and a second heat-radiating plate 28. The plates 27 and 28 are made of metal. They are laid one upon the other.

The first heat-radiating plate 27 has a bulging part 29 that swells from the second heat-radiating plate 28. As shown in FIG. 3, the bulging part 29 is a long trough and meanders over almost the entire first heat-radiating plate 27. The second heat-radiating plate 28 closes the opening of the bulging part 29. Thus, the plate 28 and the bulging part 28 of the first heat-radiating plate 27 define a coolant passage 30.

The radiator 18 has a coolant inlet port 31 and a coolant outlet port 32. The port 31 and 32 are located, respectively upstream and downstream of the coolant passage 30. The ports 31 and 32 are spaced apart in the widthwise direction of the display housing 7.

As FIGS. 1 and 3 show, the circulating path 19 comprises a forward path 33 and a backward path 34. The forward path 33 extends between the housing 4 and the display housing 7, connecting the coolant outlet port 25 of the heat-receiving portion 17 to the coolant inlet port 31 of the radiator 18. The backward path 34 extends between the housing 4 and the display housing 7, connecting the coolant outlet port 32 of the radiator 18 to the coolant inlet port 24 of the heat-receiving portion 17. The coolant passage 23 of the heat-receiving portion 17 and the coolant passage 30 of the radiator 18 are connected to each other by the circulating path 19.

The circulating path 19 and the coolant passages 23 and 30 are filled with liquid coolant. The liquid coolant is, for example, an antifreeze liquid prepared by adding ethylene glycol solution and, if necessary, corrosion inhibitor to water. The antifreeze liquid is electrically conductive.

The pump 20 is provided on the forward path 33. The pump 20 is used to circulate the liquid coolant between the heat-receiving portion 17 and the radiator 18. It is contained in the display housing 7. The pump 20 starts operating, for example, when the power switch to the portable computer 1 is closed or when the temperature of the CPU 12 rises above a predetermined value.

When the pump 20 starts operating, the liquid coolant flows in the circulating path 19 toward the radiator 18. Thus, the liquid coolant circulates between the heat-receiving portion 17 and the radiator 18. While flowing through the coolant passage 23, the liquid coolant absorbs heat from the CPU 12 and is heated. The liquid coolant thus heated flows into the radiator 18 via the forward path 33 and then flows through the coolant passage 30 of the radiator 18. While the liquid coolant is flowing through the forward path 33, heat diffuses from the liquid coolant to the first and second heat-radiating plates 27 and 28. The heat-radiating plates 27 and 28 radiate the heat.

The liquid coolant cooled by the heat exchanging in the radiator 18 flows back to the coolant passage 23 of the heat-receiving portion 17 through the backward path 34. The liquid coolant absorbs heat from the CPU 12 while it is flowing through the coolant passage 23. As the liquid coolant is repeatedly circulated between the heat-receiving portion 17 and the radiator 18, heat is transferred from the CPU 12 to the radiator 18 and radiated from the portable computer 1.

The cooling unit 16 has three connectors. The first connector connects the circulating path 19 and the heat-receiving portion 17. The second connector connects the circulating path 19 and the radiator 18. The third connector connects the circulating path 19 and the pump 20. Since the connectors lie within the housing 4 and display housing 7, some measures are taken to prevent the liquid coolant from leaking at these connectors. How the coolant is prevented from leaking at, for example, the connector connecting the heat-receiving portion 17 of the coolant outlet port 25 and the forward path 33 of the circulating path 19 will be explained.

As seen from FIGS. 5 and 7, the coolant outlet port 25 of the heat-receiving portion 17 has a tube coupling 37. The tube coupling 37 has a first connecting end 38 and an outer wall 39. Both the first connecting end 38 and the outer wall 39 are hollow cylinders. They are arranged coaxial, with the outer wall 39 surrounding the first connecting end 38. The first connecting end 38 and the outer wall 39 are formed integral with the housing 21 of the heat-receiving portion 17.

The tube coupling 37 has a receptacle 40 and an insertion port 41. The receptacle 40 is provided between the first connecting tube 38 and the outer wall 39. The insertion port 41 is remote from the housing 21 and opens to the receptacle 40. The tip of the first connecting end 38 extends through the insertion port 41 and protrudes from the receptacle 40. The first connecting end 38 has a plurality of annular projections 42 on its circumference surface. The annular projections 42 are spaced apart in the axial direction of the first connecting end 38.

The forward path 33 has a tube 44. The tube 44 is made of, for example, silicone rubber and is therefore flexible. The inner diameter of the tube 44 is equal to or a little smaller than the outer diameter of the first connecting end 38. The tube 44 has a second connecting end 45, which is connected to the tube coupling 37. The second connecting end 45 is mounted on the first connecting end 38, with its inner circumferential surface set in close contact with the outer circumferential surface of the first connecting end 38 and with the annular projections 42. Further, a band 56 made of metal tightens the second connecting end 45. The band 46 holds the second connecting end 45 of the tube 44 on the first connecting end 38 of the tube coupling 37, preventing the tube 44 from slipping off the first connecting end 38 of the tube coupling 37.

As FIG. 7 shows, the second connecting end 45 of the tube 44 is set within the receptacle 40. A packing 47 as a coolant-absorbent member fills the gap between the outer circumferential surface of the second connecting end 45 and the inner circumferential surface of the outer wall 39. The packing 47 is an elastic rubber-like body that contains, for example, super absorbent polymer. The packing 47 swells as it absorbs water. It firmly contacts the outer circumferential surface of the second connecting end 45 and the inner circumferential surface of the outer wall 39. The packing 47 covers the junction between the tube 44 and the tube coupling 37.

An annular seal 48 closes the insertion port 41 of the tube coupling 37. The seal 48 is made of rubber and can elastically deform. It conceals up the packing 47 in unison with the outer wall 39.

In this structure, the inner circumferential surface of the second connecting end 45 and the outer circumferential surface of the first connecting end 38 may no longer remain in close contact if the second connecting end 45 of the tube 44 comes to conform in shape with the first connecting end 38 of the tube coupling 37 or if the band 46 becomes loose. If this happens, part of the liquid coolant flowing in the circulating path 19 may leak into the receptacle 40 through the gap between the inner circumferential surface of the second connecting end 45 and the outer circumferential surface of the first connecting end 38.

As described above, the packing 47 that can absorb coolant covers the junction between the tube 44 and the tube coupling 37. The packing 47 absorbs the liquid coolant that has leaked into the receptacle 40. Thus, the liquid coolant remains in the receptacle 40 and would not flow from the tube coupling 37.

The packing 47 is of the type that swells as it absorbs any liquid. When it absorbs the liquid coolant, the packing 47 swells, applying a pressure on the inner circumferential surface of the outer wall 39 and the outer circumferential surface of the second connecting end 45. The second connecting end 45 of the tube coupling 44 is therefore pressed from outside, with its inner circumferential surface set in firm contact with the outer circumferential surface of the first connecting end 38. This prevents the liquid coolant from leaking at the junction between the tube 44 and the tube coupling 37. The liquid coolant would not wet the printed circuit board 9 or the CPU 12, which may malfunction or fail to work if wetted with water or the like.

As indicated above, the seal 48 closes the insertion port 41 that communicates with the receptacle 40. Thus, the packing 47 that is water-absorbent is not exposed in the housing 4. The packing 47 can hardly absorb moisture in the air. It therefore long remains water-absorbent. Hence, the packing 47 can fast absorb the liquid coolant if the coolant leaks.

This invention is not limited to the first embodiment described above. Rather, various changes and modifications can be made without departing from the scope and spirit of the invention. For instance, the outer wall of the tube coupling, which surrounds the packing, may have transparent windows and the water-absorbent polymer may contain material that changes the color of the packing when the polymer absorbs the liquid coolant. Then, the user can easily determine that the liquid coolant is leaking from the change of color of the packing, which is seen through the transparent windows.

The seal that closes the insertion port is not an indispensable component. That is, the packing may be exposed from the insertion port, outside the tube coupling.

Figure 8:
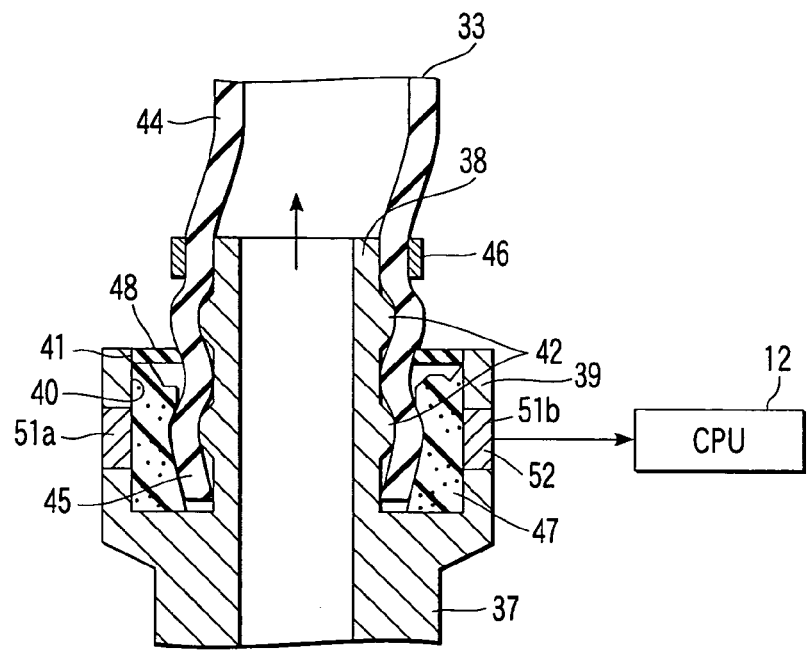
FIG. 8 is a cross-sectional view of the coupling structure that couples a tube coupling and a tube in a second embodiment of the present invention.
Figure 9:
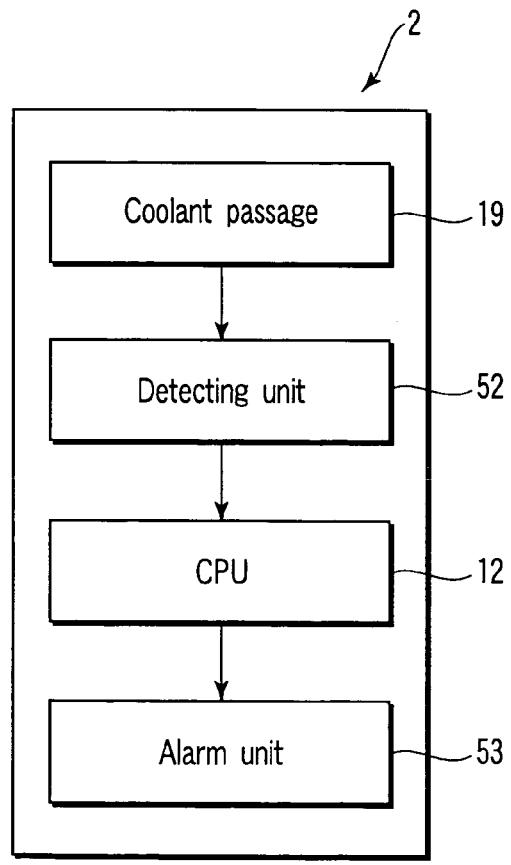
FIG. 9 is a block diagram of the second embodiment of the invention.
Figure 10:
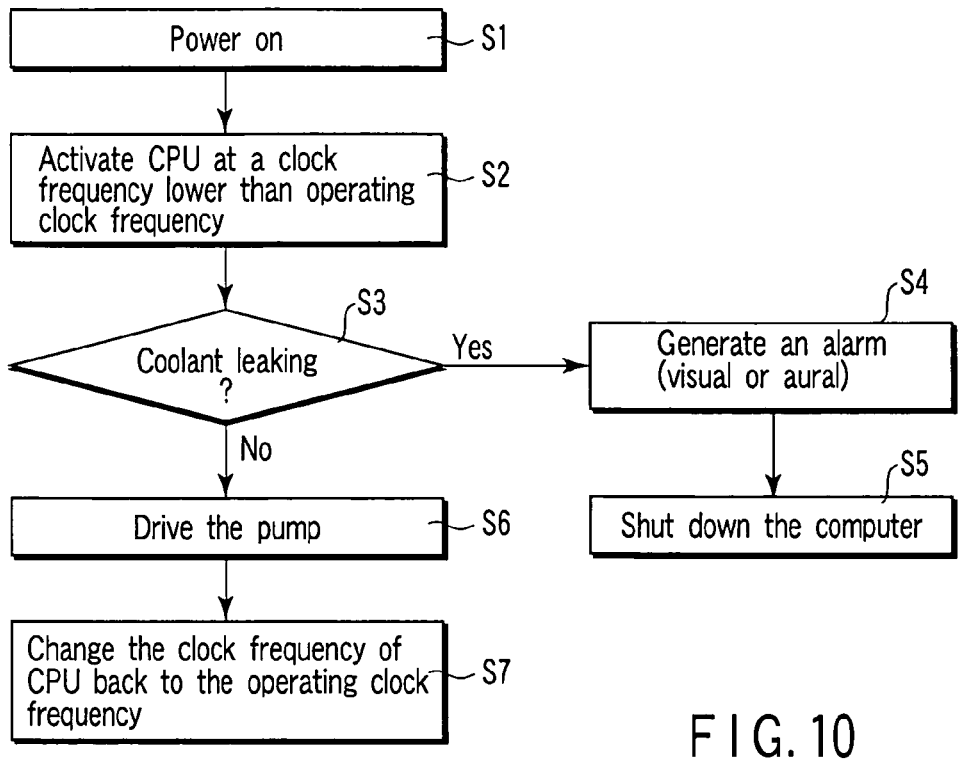
FIG. 10 is a flowchart explaining how the portable computer according to the second embodiment is shut down after the coolant leaking has been detected.

FIGS. 8 to 10 shows a second embodiment of this invention.

A portable computer 1 according to the second embodiment differs from the first embodiment in that coolant leaking, if any, is detected and it is controlled in accordance with whether the coolant is leaking or not. The portable computer 1 is identical to the first embodiment in terms of basic configuration. The components similar or identical to those of the first embodiment are designated at the same reference numerals and will not be described.

As FIG. 8 illustrates, a detecting unit 52 is embedded in the outer wall 39 of the tube coupling 37. The detecting unit 52 has a pair of electrodes 51a and 51b. The electrodes 51a and 51b oppose each other across the receptacle 40. They are exposed to the receptacle 40 and contact the packing 47.

The electrical resistance between the electrodes 51a and 51 falls as the packing 47 absorbs the liquid coolant, which is electrically conductive. From this electrical resistance the detecting unit 52 determines whether the liquid coolant is leaking or not from the junction between the tube coupling 37 and the tube 44.

FIG. 9 is a block diagram showing the components that cooperate to control the portable computer 1 in accordance with whether the liquid coolant is leaking or not. The main unit 2 of the computer 1 contains the CPU 12, the circulating path 19, and a detecting unit 52. The detecting unit 52 detects the electrical resistance between the electrodes 51a and 51b and generates a signal representing the resistance detected. The signal is supplied to the CPU 12. From the signal the CPU 12 determines whether the liquid coolant is leaking or not to control the portable computer 1. Thus, the CPU 12 functions as a control unit, too, in the second embodiment.

The main unit 2 further contains an alarm unit 53. The alarm unit 53 comprises a speaker or an indicator lamp. The speaker can generate an aural alarm, informing the user that the liquid coolant is leaking. The indicator lamp can flash to shown the user that the liquid coolant is leaking. The alarm unit 53 operates in accordance with a command from the CPU 12.

FIG. 10 is a flowchart explaining how the CPU 12 operates when the portable computer 1 is activated. As FIG. 10 shows, the user closes the power switch to the computer 1 in Step S1. In Step S2, the CPU 12 starts operating at a clock frequency that is lower than its predetermined operating clock frequency. The CPU 12 determines whether the packing 47 is absorbing the liquid coolant, from the signal supplied from the detecting unit 52 and representing the electrical resistance between the electrodes 51a and 51b.

If YES in Step S3, the operation goes to Step S4. In Step S4, the alarm unit 53 generates an alarm in accordance with the command made by the CPU 12, thus informing the computer user that the liquid coolant is leaking. The operation then goes to Step S5, in which the CPU 12 performs a process to shut down the portable computer 1.

If NO in Step S3, the operation advances to Step S6. In Step S6, the CPU 12 gives a command to the pump 20. The command drives the pump 20, which circulates the liquid coolant between the heat-receiving portion 17 and the radiator 18. Then, the operation goes to Step S7, in which the clock frequency of the CPU 12 is changed back to the operating clock frequency. As a result, the portable computer 1 assumes its normal operating condition.

In the second embodiment thus configured, it is electrically detected whether the liquid coolant is leaking or not when the portable computer 1 is activated. If the liquid coolant is found to be leaking, an alarm, either aural or visual, is generated to inform the user of the coolant leaking, and a process is performed to shut down the portable computer 1.

Thus, the portable computer 1 can be immediately shut down when the detecting unit 52 detects the coolant leaking. Then, the computer 1 may be overhauled and repaired to stop the coolant leaking. This prevents the liquid coolant from fatally damaging the CPU 12 and the other electronic parts of the computer 1.

Figure 11:
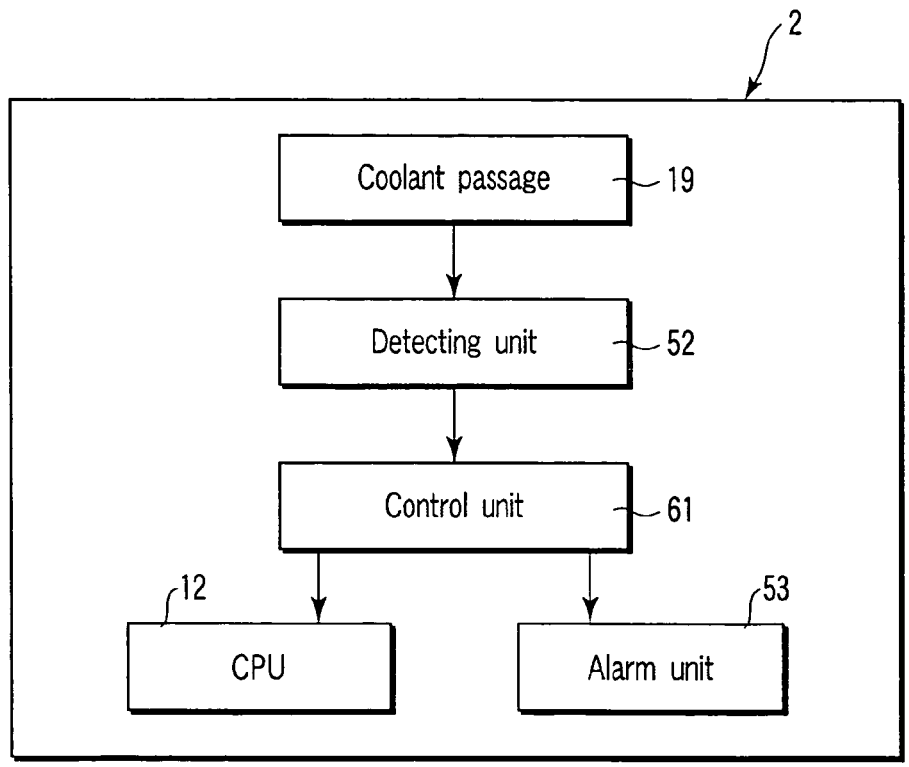
FIG. 11 is a block diagram of a third embodiment of the present invention.
Figure 12:
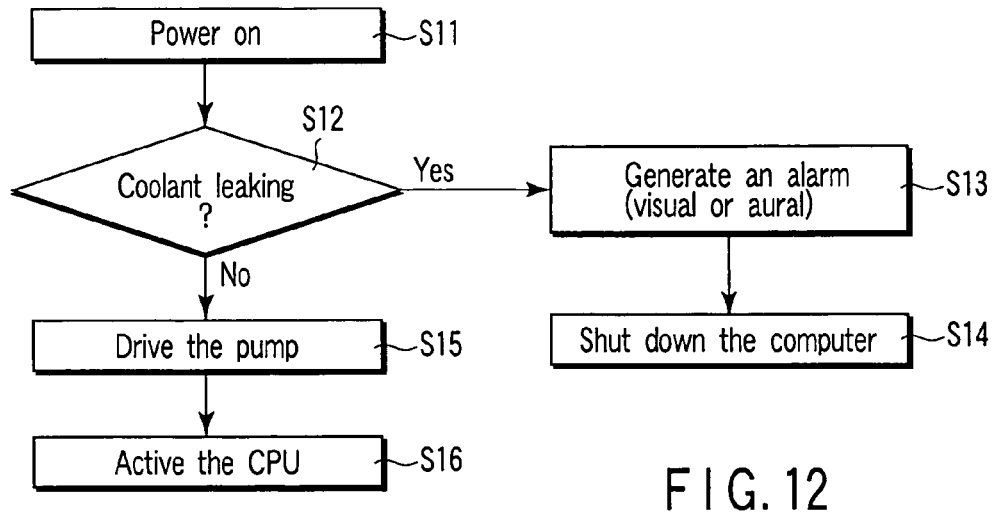
FIG. 12 is a flowchart explaining how the portable computer according to the third embodiment is shut down after the coolant leaking has been detected.

FIGS. 11 and 12 show a third embodiment of the present invention.

The portable computer 1 according to the third embodiment differs from the second embodiment in that it comprises a control unit 61 besides the CPU 12. The control unit 61 is provided in the main unit 2 of the computer 1. It comprises an electronic part, such as an LSI, mounted on the printed circuit board 9.

FIG. 12 is a flowchart explaining how the CPU 12 operates when the portable computer 1 is activated. As seen from FIG. 12, the user closes the power switch to the computer 1 in Step S11. In Step S12, the control unit 61 determines whether the liquid coolant is leaking or not. More precisely, it determines whether or not the packing 47 is absorbing the liquid coolant, from the signal supplied from the detecting unit 52 and representing the electrical resistance between the electrodes 51a and 51b.

If YES in Step S12, the operation goes to Step S13. In Step S13, the alarm unit 53 generates an alarm in accordance with a command supplied from the control unit 61, thus informing the computer user that the liquid coolant is leaking. The operation then goes to Step S14, in which the control unit 61 performs a process to shut down the portable computer 1.

If NO in Step S12, the operation advances to Step S15. In Step S15, the control unit 61 gives a command to the pump 20. The command drives the pump 20, which circulates the liquid coolant between the heat-receiving portion 17 and the radiator 18. Then, the operation advances to Step S16, in which the control unit 61 gives a command to the CPU 12. Upon receipt of the command the CPU 12 starts operating. As a result, the portable computer 1 assumes its normal operating condition.

In the third embodiment thus configured, the control unit 61 determines whether the liquid coolant is leaking, when the portable computer 1 is activated. Further, the control unit 61 performs the process of shutting down the computer 1 or the process of activating the CPU 12, in accordance with whether the liquid coolant is leaking or not.

Hence, the portable computer 1 can be immediately shut down when the coolant is found to be leaking. This prevents the liquid coolant from fatally damaging the CPU 12 and the other electronic parts of the computer 1.

In the third embodiment, the pump 20 may be driven after the CPU 12 is activated, provided that the heat-receiving portion 17 that receives heat from the CPU 12 has a sufficient heat capacity.

Figure 13:
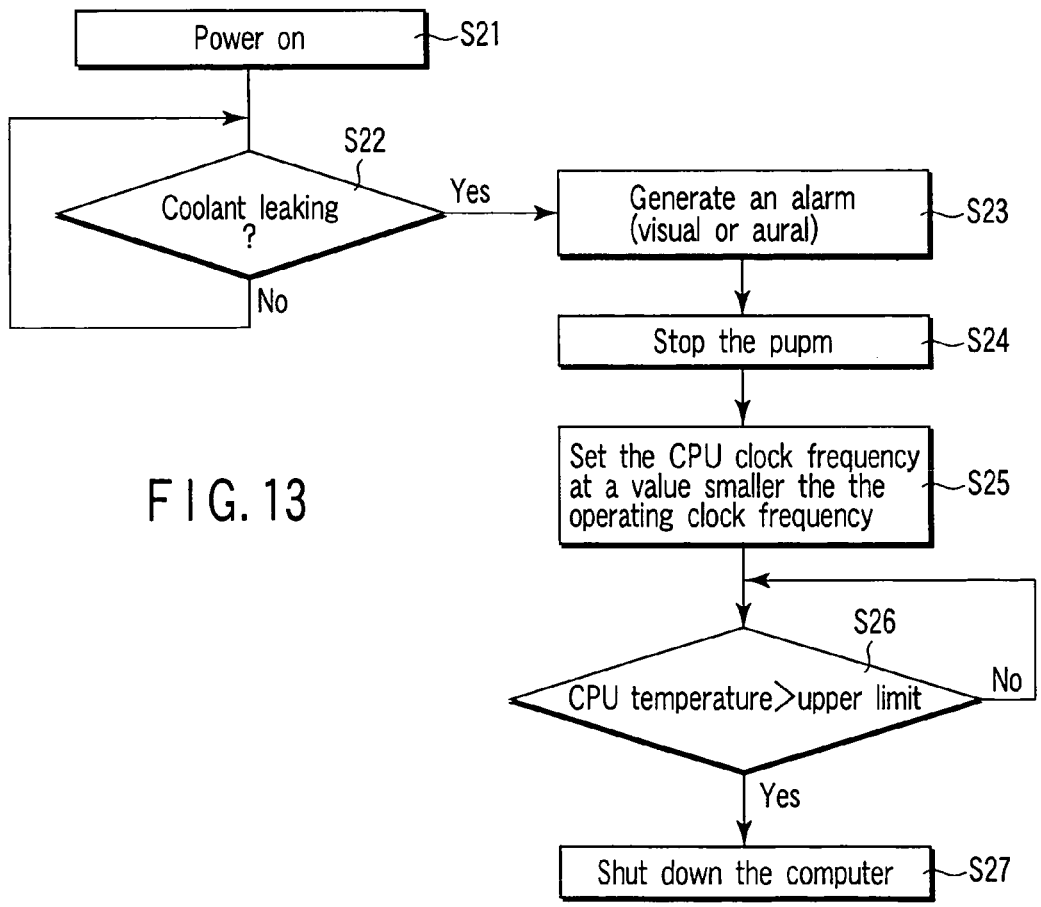
FIG. 13 is a flowchart explaining how the portable computer according to a fourth embodiment is shut down after the coolant leaking has been detected.

FIG. 13 is a flowchart pertaining to a fourth embodiment of this invention.

The portable computer 1 according to the fourth embodiment can keep operating as long as the CPU 12 remains properly cooled, even if the liquid coolant happens to leak. The fourth embodiment is similar to the third embodiment in any other respects.

FIG. 13 is a flowchart explaining how the CPU 12 operates when the portable computer 1 is activated. As FIG. 13 shows, the user closes the power switch to the computer 1 in Step S21. The operation goes to Step S22, in which it is determined whether the liquid coolant is leaking or not. More specifically, the control unit 61 determines whether the packing 47 is absorbing the liquid coolant, from the electrical resistance represented by the signal supplied from the detecting unit 52. If NO, Step S22 is performed again to determine whether the liquid coolant is leaking.

If YES in Step S22, or if the control unit 61 determines that the coolant is leaking, the operation advances to Step S23. In Step S23, the alarm unit 53 contained in the housing 4 operates in accordance with the command made by the control unit 61, informing the user that the liquid coolant is leaking. The operation then goes to Step S24. In Step 24, the control unit 61 performs the process of stopping the pump 20. As a result, the liquid coolant stops circulating between the heat-receiving portion 17 and the radiator 18.

When the liquid coolant stops circulating, the operation goes to Step S25. In Step 25, the control unit 61 performs the process of lowering the clock frequency of the CPU 12 from the operating clock frequency thereof. Thus, the CPU 12 generates less heat than before. Then, in Step S26, the control unit 61 determines whether the temperature of the CPU 12 has risen above a prescribed upper limit. If NO in Step S26, or if the temperature of the CPU 12 has not risen above the upper limit, the control unit 61 performs Step S26 again.

If YES in Step S26, or if the temperature of the CPU 12 rises above the upper limit, the operation advances to Step S27. In Step S27, the control unit 61 performs the process of shutting down the portable computer 1.

In the fourth embodiment described above, the liquid coolant immediately stops circulating when the detecting unit 52 detects the coolant leaking. This prevents the coolant from further leaking at the joint on the circulating path 19.

After the liquid coolant stops circulating, the clock frequency of the CPU 12 is lowered, thereby suppressing the heat generation in the CPU 12. Further, the portable computer 1 keeps operating, while the temperature of the CPU 12 is being monitored. This is desirable in the case where the portable computer 1 cannot be stopped at once if the liquid coolant happens to leak.

Figure 14:
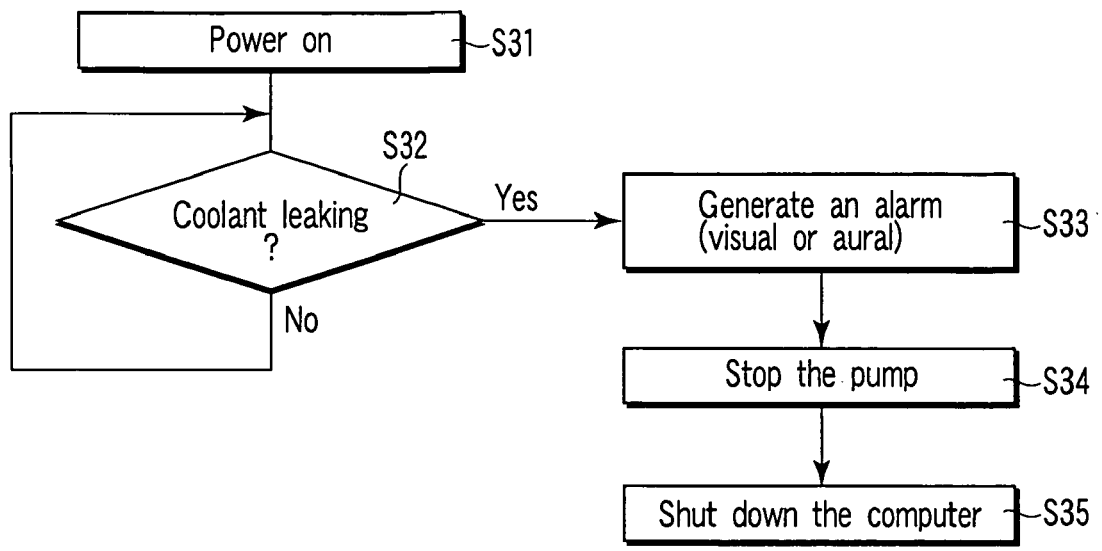
FIG. 14 is a flowchart explaining how the portable computer according to a fifth embodiment is shut down after the coolant leaking has been detected.

FIG. 14 is a flowchart pertaining to a fifth embodiment of the present invention.

The fifth embodiment differs from the fourth embodiment in that the portable computer 1 is immediately stopped when the liquid coolant happens to leak.

More exactly, FIG. 14 is a flow chart that explains how the CPU 12 operates when the portable computer 1 is activated. As seen form FIG. 14, the user closes the power switch to the computer 1 in Step S31. The operation then goes to Step S32, in which it is determined whether the liquid coolant is leaking or not. That is, the control unit 61 determines whether the packing 47 is absorbing the liquid coolant, from the electrical resistance represented by the signal supplied from the detecting unit 52. If NO, Step S32 is performed again to determine whether the liquid coolant is leaking.

If YES in Step S32, or if the liquid coolant is leaking, the operation advances to Step S33. In Step S33, the control unit 61 gives a command to the alarm unit 53 provided in the housing 4. Upon receipt of the command, the alarm unit 53 generates an alarm, informing the user that the liquid coolant is leading. The operation then advances to Step S34. In Step S34, the control unit 61 performs the process of stopping the pump 20. As a result, the liquid coolant stops circulating between the heat-receiving portion 17 and the radiator 18. Next, the operation goes to Step S35. In Step S35, the control unit 61 performs the process of shutting down the portable computer 1.

Figure 15:
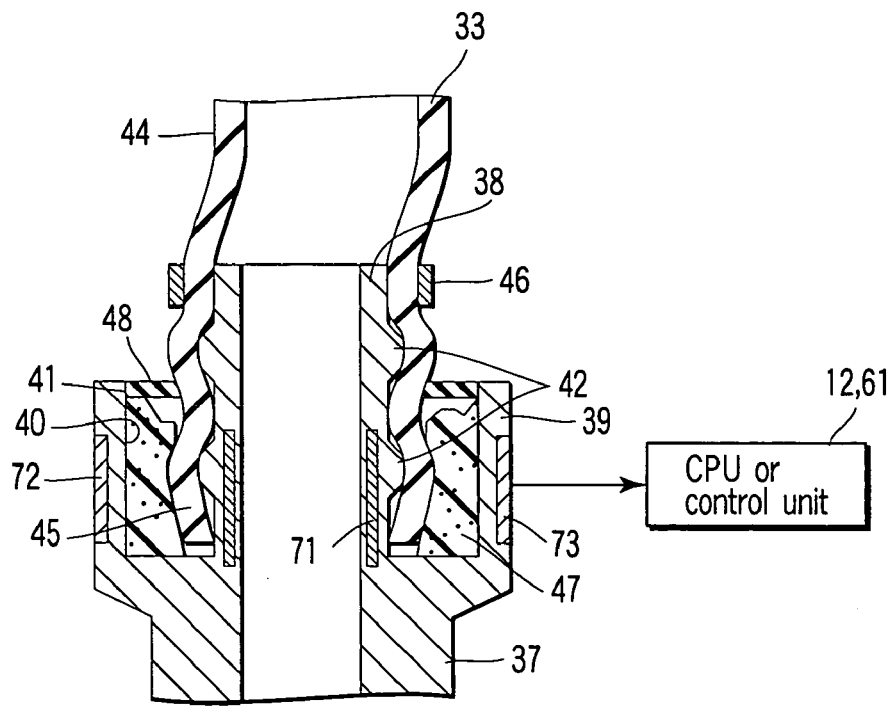
FIG. 15 is a cross-sectional view of the coupling structure that couples a tube coupling and a tube in a sixth embodiment of the present invention.

FIG. 15 illustrates a sixth embodiment of this invention.

The portable computer 1 according to the sixth embodiment differs from the second embodiment in regard to the configuration that detects whether the packing 47 is absorbing the liquid coolant. The sixth embodiment is identical to the second embodiment in any other respects.

As FIG. 15 shows, a first electrode 71 is embedded in the first connecting end 38 of the tube coupling 37, and a second electrode 72 is embedded in the outer wall 39 of the tube coupling 37. The first electrode 71 and the second electrode 72 oppose each other, across the packing 47. When the packing 47 absorbs the liquid coolant, the electrostatic capacitance between the electrodes 71 and 72 changes, because the liquid coolant is electrically conductive. A signal representing this change in the electrostatic capacitance is supplied to the CPU 12 or the control unit 61. Thus, the first electrode 71 and second electrode 72 constitute a detecting unit 73 that determines whether or not the packing 47 is absorbing the liquid coolant.

In the sixth embodiment, too, whether the liquid coolant is leaking or not can be determined since a signal representing the change in the capacitance between the electrodes 71 and 72 is input to the CPU 12 or the control unit 61. Hence, the portable computer 1 can be activated and shut down in accordance with whether the coolant is leaking or not, as in the second to fifth embodiments. This prevents the liquid coolant from fatally damaging the CPU 12 and the other electronic parts of the computer 1 in the sixth embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An electronic apparatus comprising:
   a housing;
   a heat-generating component which is contained in the housing;
   a circulating path through which liquid coolant for cooling the heat-generating component flows, the circulating path having a first connecting end and a second connecting end connected to the first connecting end;
   a coolant-absorbent member which covers a junction between the first connecting end and the second connecting end;
   a detecting unit which detects whether the member is absorbing the liquid coolant; and
   a control unit which determines that the liquid coolant is leaking at the junction between the first and second connecting ends, when the detecting unit detects that the member is absorbing the liquid coolant.

2. The electronic apparatus according to claim 1, further comprising an alarm unit which generates an alarm indicating that the liquid coolant is leaking at the junction between the first and second connecting ends, in accordance with a command given by the control unit when the detecting unit detects the liquid coolant absorbed into the member.

3. The electronic apparatus according to claim 1, wherein the control unit stops the electronic apparatus when the liquid coolant leaks.

4. The electronic apparatus according to claim 1, wherein the circulating path includes a heat-receiving portion which receives heat of the heat-generating component, a heat-radiating portion which radiates the heat of the heat-generating component, and a pump which circulates the liquid coolant between the heat-receiving portion and the heat-radiating portion.

5. The electronic apparatus according to claim 4, wherein the pump operates when the control unit gives a command upon detecting that the liquid coolant is not leaking.

6. The electronic apparatus according to claim 4, wherein the control unit stops the pump when the liquid coolant is leaking.

7. The electronic apparatus according to claim 1, wherein the detecting unit has a pair of electrodes contacting the member and determines whether the liquid coolant is leaking at the junction between the first and second connecting ends, on the basis of an electrical resistance between the electrodes.

8. The electronic apparatus according to claim 1, wherein the detecting unit has first and second electrodes opposing each other across the member and determines whether the liquid coolant is leaking at the junction between the first and second connecting ends, on the basis of a change in an electrostatic capacitance between the first and second electrodes.

9. An electronic apparatus comprising:
a housing;
a central processing unit which is contained in the housing and which generates heat while operating;
a circulating path through which liquid coolant for cooling the central processing unit flows, the circulating path having a first connecting end and a second connecting end connected to the first connecting end;
a coolant-absorbent member which covers a junction between the first connecting end and the second connecting end;
a detecting unit which detects whether the member is absorbing the liquid coolant; and
a control unit which determines that the liquid coolant is leaking at the junction between the first and second connecting ends, when the detecting unit detects that the member is absorbing the liquid coolant, the control unit being configured to lower a clock frequency of the central processing unit from a predetermined operating clock frequency of the central processing unit while the liquid coolant is leaking, to compare a temperature of the central processing unit with an upper limit and to stop the electronic apparatus when the temperature of the central processing unit is higher than the upper limit.

10. The electronic apparatus according to claim 9, further comprising an alarm unit which generates an alarm indicating that the liquid coolant is leaking at the junction between the first and second connecting ends, the alarm unit being configured to operate when the control unit gives a command upon detecting that the liquid coolant is leaking.

11. The electronic apparatus according to claim 10, wherein the circulating path includes a pump which circulates the liquid coolant and the control unit stops the pump while the liquid coolant is leaking.

12. The electronic apparatus according to claim 11, wherein the control unit operates the alarm unit before stopping the pump.

13. An electronic apparatus comprising:
a housing;
a central processing unit which is contained in the housing, the central processing unit generating heat while operating, the central processing unit being activated at a clock frequency lower than a predetermined operating frequency, when a power switch of the electronic apparatus is closed;
a circulating path through which liquid coolant for cooling the central processing unit flows, the circulating path having a first connecting end and a second connecting end connected to the first connecting end;
a coolant-absorbent member which covers a junction between the first connecting end and the second connecting end; and
a detecting unit which detects whether the member is absorbing the liquid coolant,
wherein the central processing unit determines that the liquid coolant is leaking at the junction between the first connecting end and the second connecting end and stops the electronic apparatus, when the detecting unit detects that the member is absorbing the liquid coolant, and performs a process of changing the clock frequency back to the operating clock frequency when the detecting unit does not detect that the member is absorbing the liquid coolant.

14. The electronic apparatus according to claim 13, further comprising an alarm unit which generates an alarm indicating that the liquid coolant is leaking at the junction between the first and second connecting ends, the alarm unit being configured to operate when the control unit gives a command upon detecting that the liquid coolant is leaking.

* * * * *